United States Patent [19]
Marchetti et al.

[11] 3,969,638
[45] July 13, 1976

[54] INTEGRATED CIRCUIT BREAKER

[75] Inventors: Gianfranco Marchetti, S.Fruttuoso, Milan; Giovanpietro Bassani, Milan, both of Italy

[73] Assignee: Societa Italiana Telecomunicazioni Siemens S.p.A., Milan, Italy

[22] Filed: Jan. 2, 1975

[21] Appl. No.: 537,920

[30] Foreign Application Priority Data
Jan. 4, 1974 Italy .................................. 19073/74

[52] U.S. Cl. ........................... 307/243; 179/15 AN; 307/251; 328/154
[51] Int. Cl.² ................. H03K 17/60; H03K 17/16; H04J 3/10
[58] Field of Search ........ 307/235 A, 251, 240–243; 328/152, 154; 179/15 AN, 15 R

[56] References Cited
UNITED STATES PATENTS

| | | |
|---|---|---|
| 3,433,899 | 3/1969 | Pfleiderer .................... 179/15 AN |
| 3,539,928 | 11/1970 | Gardner et al ................. 307/251 X |
| 3,676,802 | 7/1972 | Murphree ..................... 307/251 X |
| 3,872,325 | 3/1975 | Adams et al ...................... 307/251 |

OTHER PUBLICATIONS
Heierling, "Feldeffekttransistoren a/s Koppelpukte in der Fernsprechtechnik"; Nachrichtentechn. Z. 23, (1970), No. 10; pp. 522–526 (German).

Falcoz et al., "Floating Impulse Current Source"; IBM Tech. Discl. Bull.; vol. 13, No. 8, pp. 2349.

*Primary Examiner*—John S. Heyman
*Assistant Examiner*—L. N. Anagnos
*Attorney, Agent, or Firm*—Karl F. Ross; Herbert Dubno

[57] ABSTRACT

An integrated circuit for the selective completion and interruption of a signal path comprises three transistors of the MOSFET type, i.e., a switching transistor in tandem with a decoupling transistor and a pilot transistor in cascade with the switching transistor. The channels of the switching and decoupling transistors lie in series between supply terminals of opposite potential, together with a load resistor. The channel of the pilot transistor is connected across the same supply terminals by way of a biasing resistor tied to the gate of the switching transistor. On/off voltages are applied to the gate of the pilot transistor while incoming signals are fed to the gate of the decoupling transistor.

8 Claims, 2 Drawing Figures

INTEGRATED CIRCUIT BREAKER

FIELD OF THE INVENTION

Our present invention relates to a circuit breaker of the integrated kind, serving for the selective completion and interruption of a signal path, as well as to a switching system incorporating a plurality of such circuit breakers for the selective energization of a load from a corresponding number of input terminals carrying different signals.

BACKGROUND OF THE INVENTION

Semiconductive devices are widely used as electronic switches. Besides the usual bipolar transistors, field-effect transistors (FETs) can be used for this purpose, especially those of the MOS (metal-oxide-semiconductor) type known as MOSFETs. With transistors of this nature it is possible to combine a multiplicity of switching circuits into an integrated and miniaturized module also including associated impedance elements such as resistors and capacitors.

In a system requiring complete cutoff of a signal path, however, the inherent capacitance of the MOSFET constitutes a residual admittance whose presence prevents complete insulation of the load from the signal input. In a time-division-multiplex (TDM) telecommunication system, for example, such incomplete insulation gives rise to cross-talk between the individual communication links.

Another problem heretofore encountered in such switching circuits is the need for an ancillary or pilot transistor to which a control voltage independent of the input signal is applied for turning the main or switching transistor on and off, this pilot transistor normally drawing a certain amount of current even in the nonconducting state of the switching transistor. Since in a TDM system each switching transistor generally is to conduct only during a small fraction of a cycle, the dissipation of energy by the associated pilot transistors is particularly wasteful.

OBJECTS OF THE INVENTION

An important object of our invention, therefore, is to provide an improved integrated switching circuit of the character described which draws virtually no current in the open-circuit condition.

Another object is to provide improved means in such a circuit, fully integrated therewith, for effectively decoupling the signal input from the load during cutoff.

SUMMARY OF THE INVENTION

In accordance with the present invention, we provide a first and a second MOSFET respectively serving as the aforementioned switching and pilot transistors, each of these MOSFETs having the usual two principal electrodes (source and drain) at opposite ends of a channel and a gate conductively isolated from that channel but capacitively coupled therewith. The channel of the first MOSFET is connected, by way of an output resistance, across a supply of direct current which also feeds the channel of the second MOSFET in series with a biasing resistor. The gate of the first MOSFET is connected to this biasing resistor while that of the second MOSFET is connected to a control unit for alternately turning the first MOSFET on and off through the energization of de-energization of the biasing resistor.

According to another feature of our invention, a third MOSFET acting as a decoupling transistor has its channel connected in series with that of the first MOSFET and also with the output resistance, the gate of this third MOSFET receiving the input signal which is to be transmitted to the output resistance or to a load connected across the latter. Thus, the first MOSFET lies in cascade with the second MOSFET but in tandem with the third MOSFET so as to disconnect one of the principal electrodes of this third MOSFET from the power supply when the first MOSFET is rendered nonconductive by the application of a cutoff voltage to the gate of the second MOSFET.

Advantageously, all three MOSFETs are of the same conductivity type (e.g. P-channel) and have substrates connected to a supply terminal other than the one to which the biasing resistor is connected, these substrates being biased positive in the case of P-channel MOSFETs.

With incorporation of a plurality of such three-transistor circuits into a common module serving as a switching matrix, the output resistance referred to above may be constituted by a resistor common to the several signal paths.

BRIEF DESCRIPTION OF THE DRAWING

The above and other features of our invention will now be described in detail with reference to the accompanying drawing in which.

SPECIFIC DESCRIPTION

Figure 1:
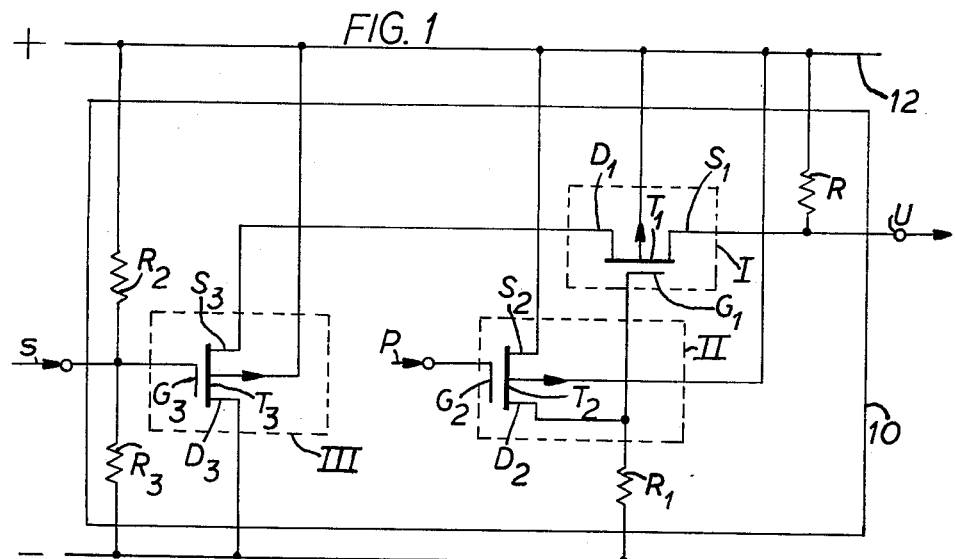
FIG. 1 diagrammatically shows an integrated circuit embodying our invention.

In FIG. 1 we have shown a block or wafer 10 of semiconductive material with three integrated stages, i.e., a switching stage I, a pilot stage II and a decoupling stage III. The three stages consist essentially of three substantially identical MOSFETs $T_1$, $T_2$ and $T_3$ each formed in an N-type substrate and comprising P-type drain and source electrodes $S_1$, $D_1$, $S_2$, $D_2$ and $S_3$, $D_3$ at opposite ends of a P-channel which is separated from an associated gate electrode $G_1$, $G_2$, $G_3$. A d-c power supply comprises a negative bus bar 11 and a positive bus bar 12, bus bar 12 being connected via an output resistance R to source $S_1$ and directly to source $S_2$ whereas bus bar 11 is connected via a biasing resistor $R_1$ to drain $D_2$ and directly to drain $D_3$. Drain $D_1$ and source $S_3$ are tied together so that the channels of MOSFETs $T_1$ and $T_3$ are serially interconnected, with their respective principal electrodes $S_1$, $S_3$ and $D_1$, $D_3$, across these bus bars in series with resistance R. An output terminal U, which may be connected to a nonillustrated load, is tied to source $S_1$. MOSFETs $T_1$, $T_2$ and $T_3$ have substrates all connected to positive bus bar 12.

Gate $G_1$ is connected to drain $D_2$ whereas gate $G_3$ is joined to a tap of a voltage divider $R_2$, $R_3$ bridges across bus bars 11 and 12. Gate $G_3$ receives input signals $s$, to be transmitted to output terminal U, whereas gate $G_2$ is energizable with positive control pulses p to cut off the MOSFET $T_2$, thereby driving negative the gate $G_1$ of MOSFET $T_1$ which thus conducts. In the present of a positive voltage $p$, therefore, the signal $s$ (which could be an amplitude sample of a voice message in a TDM telephone system) can pass through the circuit of FIG. 1 to reach the load terminal U.

In the absence of a positive control voltage $p$, i.e. with the gate $G_2$ held at substantially the potential of negative bus bar 11, MOSFET $T_2$ conducts whereby gate $G_1$ is biased positive from bus bar 11 through resistor $R_1$ so that MOSFET $T_1$ is cut off. Source $S_3$ is then effectively disconnected from its current supply 12 so that MOSFET $T_3$ does not respond to the input signal $s$. It should be noted that the nonillustrated generator of this input signal sees substantially the same impedance whether or not transistor $T_1$ conducts.

Figure 2:
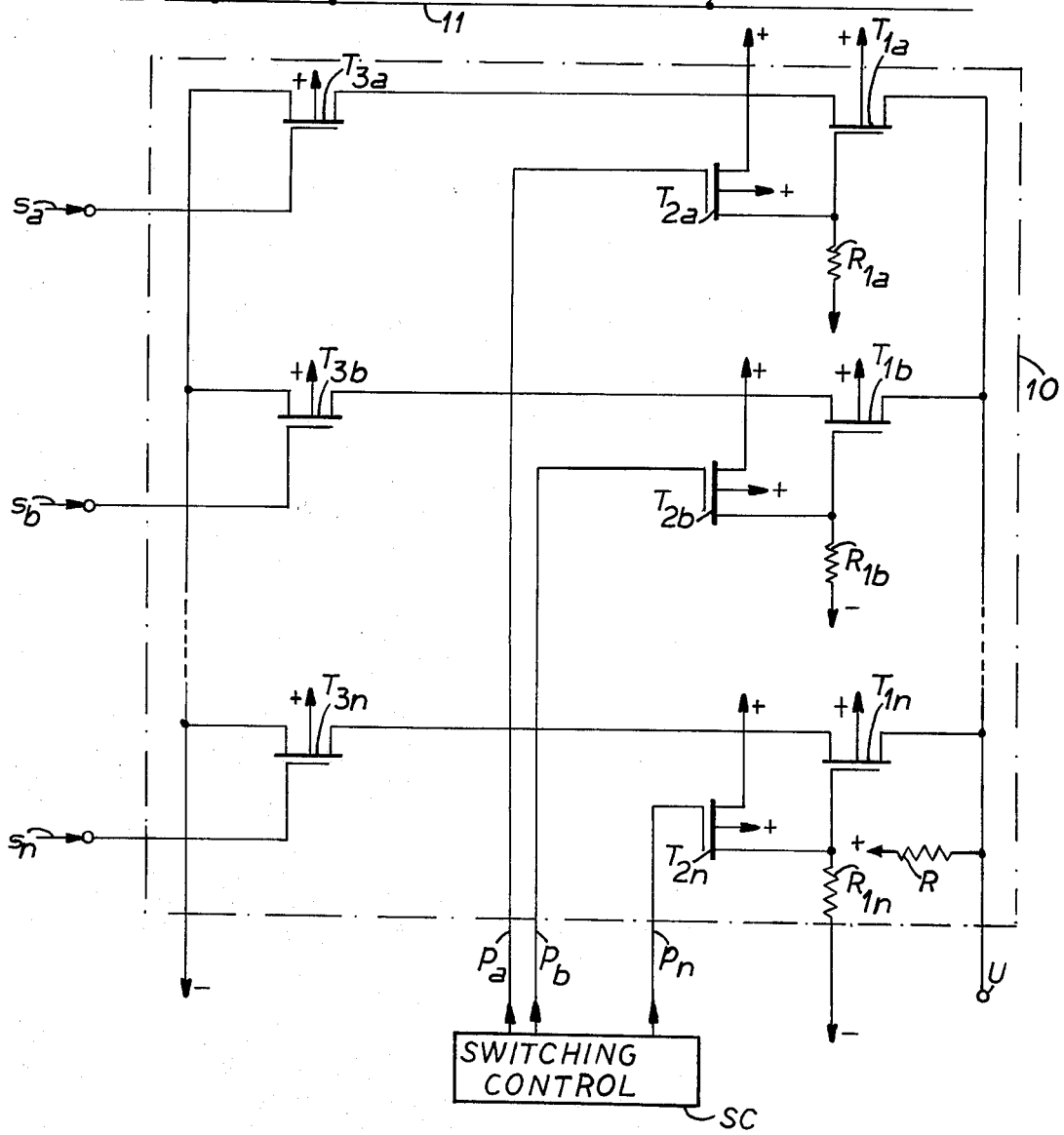
FIG. 2 is a diagram illustrating an integrated switching system incorporating a plurality of circuits as shown in FIG. 1.

In FIG. 2 we have shown an expanded version of module 10 accommodated a number $n$ of signal paths each similar to that of FIG. 1. The corresponding switching, pilot and decoupling transistors have been shown in FIG. 2 as MOSFETs $T_{1a}$, $T_{1b}$, ... $T_{1n}$, $T_{2a}$, $T_{2b}$, ... $T_{2n}$ and $T_{3a}$, $T_{3b}$, ... $T_{3n}$. The gates of switching transistors $T_{1a}$ - $T_{1n}$ are connected to negative potential via respective biasing resistors $R_{1a}$, $R_{1b}$, ... $R_{1n}$ whereas their sources extend to positive potential by way of a common outut resistor R. The gates of decoupling transistors $T_{3a}$ - $T_{3n}$ receive respective input signals $s_a$, $s_b$, ... $s_n$. Control pulses $P_a$, $P_b$, ... $P_n$ are delivered to the gates of pilot transistors $T_{2a}$ - $T_{2n}$, in a predetermined sequence, by a switching unit SC which may be a decoder of distribution signals accompanying a group of line signals $s_a$ - $s_n$ as well known per se. Thus, as described above with reference to FIG. 1, only one signal path at a time is completed while all the others are blocked to avoid any cross-talk between the several communication links.

It will be apparent that the decoupling transistor $T_3$ of any signal path draws no current when the associated switching transistor $T_1$ is cut off, owing to the fact that the two transistors are in cascade. The substrates of these transistors are connected to one supply terminal (here positive) whereas the gate of transistor $T_1$ is connected through resistor $R_1$ to the opposite supply terminal (here negative). The polarities of bus bars 11 and 12 will have to be changed if P-type substrates with N-channel MOSFETs are used in lieu of the arrangement described.

We claim:

1. An integrated circuit for the selective completion and interruption of a signal path, comprising:
    a supply of direct current;
    a first, a second and a third MOSFET each having a pair of principal electrodes at opposite ends of a channel and a gate capacitively coupled with said channel;
    a biasing resistor connected across said supply in series with the principal electrodes and the channel of said second MOSFET, said biasing resistor being directly connected to a first terminal of said supply, said first and second MOSFETs having substrates connected to a second terminal of said supply, the gate of said first MOSFET being connected to said first terminal through said biasing resistor;
    conductor means including an output resistance connecting the principal electrodes and the channel of said first MOSFET across said supply, the channel and the principal electrodes of said first MOSFET being connected in series with the channel and the principal electrodes of said third MOSFET and with said output resistance;
    control means connected to the gate of said second MOSFET for alternately turning said first MOSFET on and off through energization and de-energization, respectively, of said biasing resistor; and
    input means connected to the gate of said third MOSFET for supplying thereto a signal to be transmitted to said output resistance in a conductive condition of said first MOSFET.

2. An integrated circuit as defined in claim 1 wherein said first, second and third MOSFETs ae of like conductivity type.

3. An integrated circuit as defined in claim 2 wherein said third MOSFET has a substrate connected to said second terminal.

4. In a switching system for selectively energizing a load from a plurality of input terminals carrying different signals, in combination:
    a plurality of signal paths, one for each input terminal, comprising each a first, a second and a third MOSFET each having a pair of principal electrodes at opposite ends of a channel and a gate capacitively coupled with said channel, the gate of each third MOSFET being connected to the respective input terminal;
    a supply of direct current;
    conductor means serially connecting the principal electrodes and the channels of the first and third MOSFETs of each signal path across said supply;
    an output resistance common to said signal paths in series with the serially interconnected channels of said first and third MOSFETs;
    a biasing resistor individual to each signal path connected to the gate of said first MOSFET thereof, the principal electrodes and the channel of said second MOSFET being connected across said supply in series with said biasing resistor; and
    control means connected to the gate of said second MOSFET of each signal path for alternately turning the associated first MOSFET on and off through energization and de-energization, respectively, of said second MOSFET.

5. The combination defined in claim 4 wherein said MOSFETs, said biasing resistors and said load resistor are part of a single integrated module.

6. The combination defined in claim 5 wherein all said MOSFETs are of like conductivity type.

7. The combination defined in claim 6 wherein said biasing resistors are connected in parallel to a first terminal of said supply, the substrates of all said MOSFETs being connected to a second terminal of said supply.

8. The combination defined in claim 7 wherein said output resistance is inserted between said second terminal and respective principal electrodes of said first MOSFET.

* * * * *